United States Patent
Iwase

(10) Patent No.: US 10,164,210 B2
(45) Date of Patent: Dec. 25, 2018

(54) FUNCTIONAL FILM

(71) Applicant: FUJIFILM Corporation, Tokyo (JP)

(72) Inventor: Eljiro Iwase, Ashigarakami-gun (JP)

(73) Assignee: FUJIFILM Corporation, Tokyo (JP)

(*) Notice: Subject to any disclaimer, the term of this patent is extended or adjusted under 35 U.S.C. 154(b) by 503 days.

(21) Appl. No.: 14/825,354

(22) Filed: Aug. 13, 2015

(65) Prior Publication Data

US 2015/0349290 A1 Dec. 3, 2015

Related U.S. Application Data

(63) Continuation of application No. PCT/JP2014/056231, filed on Mar. 11, 2014.

(30) Foreign Application Priority Data

Mar. 19, 2013 (JP) .................... 2013-056112

(51) Int. Cl.
*H01L 51/52* (2006.01)
*B32B 27/32* (2006.01)
(Continued)

(52) U.S. Cl.
CPC ............ *H01L 51/5246* (2013.01); *B32B 7/02* (2013.01); *B32B 7/10* (2013.01); *B32B 7/12* (2013.01);
(Continued)

(58) Field of Classification Search
CPC .... B32B 7/02; B32B 7/10; B32B 7/12; B32B 27/325; B32B 27/32; B32B 2307/40;
(Continued)

(56) References Cited

U.S. PATENT DOCUMENTS

2005/0112337 A1* 5/2005 Jester ............... B32B 27/08
428/200
2007/0184292 A1* 8/2007 Lee .................. H01L 51/5256
428/475.5
(Continued)

FOREIGN PATENT DOCUMENTS

| JP | 2008-1760 A | 1/2008 |
| JP | 2010-198926 A | 9/2010 |
| JP | 2011-526052 A | 9/2011 |
| JP | 5036628 B2 | 9/2012 |
| JP | 2013-43382 A | 3/2013 |
| KR | 10-2010-0011900 A | 2/2010 |

OTHER PUBLICATIONS

"A Guide to Silane Solutions". Dow Corning, (2005); pp. 1-29.*
(Continued)

*Primary Examiner* — Prashant J Khatri
(74) *Attorney, Agent, or Firm* — Birch, Stewart, Kolasch & Birch, LLP

(57) ABSTRACT

A functional film has a support which has a value of retardation of equal to or less than 50 nm; a protective inorganic film which is formed on the support; one or more combinations, each of which is composed of an organic film as an underlayer and an inorganic film, formed on the protective inorganic film; and a sealant layer which adheres onto the inorganic film as an uppermost layer by an adhesive layer, has a value of retardation of equal to or less than 300 nm, and has a glass transition temperature lower than that of the support.

9 Claims, 2 Drawing Sheets

(51) Int. Cl.
  *B32B 7/12* (2006.01)
  *B32B 7/02* (2006.01)
  *B32B 7/10* (2006.01)
(52) U.S. Cl.
  CPC ............ *B32B 27/32* (2013.01); *B32B 27/325* (2013.01); *H01L 51/5253* (2013.01); *H01L 51/5256* (2013.01); *H01L 51/5262* (2013.01); *B32B 2255/10* (2013.01); *B32B 2255/20* (2013.01); *B32B 2255/26* (2013.01); *B32B 2255/28* (2013.01); *B32B 2307/31* (2013.01); *B32B 2307/40* (2013.01); *B32B 2457/206* (2013.01); *H01L 2251/55* (2013.01); *Y10T 428/2495* (2015.01); *Y10T 428/24942* (2015.01)
(58) Field of Classification Search
  CPC .......... B32B 2307/31; B32B 2457/206; B32B 2255/10; B32B 2255/26; B32B 2255/28; H01L 51/5237–51/5259; H01L 2251/55; Y10T 428/24942; Y10T 428/2495
  See application file for complete search history.

(56) References Cited

U.S. PATENT DOCUMENTS

| | | |
|---|---|---|
| 2010/0015431 A1* | 1/2010 | Matsui .............. B29C 66/82661 428/323 |
| 2010/0019654 A1 | 1/2010 | Hayashi |
| 2011/0073901 A1 | 3/2011 | Fujita et al. |
| 2014/0134362 A1 | 5/2014 | Iwase et al. |

OTHER PUBLICATIONS

Extended European Search Report dated May 9, 2016 in corresponding Application No. EP 14767426.1.
International Search Report, issued in PCT/JP2014/056231, dated Jun. 10, 2014.
Written Opinion of the International Searching Authority, issued in PCT/JP2014/056231, dated Jun. 10, 2014.
Korean Office Action dated Sep. 9, 2016, for Korean Application No. 10-2015-7022266 with the English translation.

\* cited by examiner

FUNCTIONAL FILM

CROSS-REFERENCE TO RELATED APPLICATIONS

This application is a Continuation of PCT International Application No. PCT/JP2014/56231, filed on Mar. 11, 2014, which claims priority under 35 U.S.C. § 119(a) to Japanese Patent Application No. 2013-056112, filed on Mar. 19, 2013. Each of the above application(s) is hereby expressly incorporated by reference, in its entirety, into the present application.

BACKGROUND OF THE INVENTION

1. Field of the Invention

The present invention relates to a functional film preferably used as a sealing substrate of an organic EL device in which a light emitting element is protected with a passivation film.

2. Description of the Related Art

An organic EL device (OLED device) including an organic electro luminescence (EL) material is used in displays, illumination devices, and the like.

The organic EL material used in the organic EL device is extremely vulnerable to moisture. Therefore, for the organic EL device, a structure in which the peripheral portion thereof is sealed with a glass plate or a metal plate is adopted to prevent deterioration of the organic EL material due to moisture.

However, in such a method, because the entirety of the device is sealed with a metal or glass, the organic EL device becomes heavy and thick. Furthermore, with such a method, it is difficult to follow the recent trend that requires organic EL devices, which use the organic EL unit such as an organic EL display, to be more flexible.

In order to solve the above problems, as disclosed in JP2010-198926A and JP5036628B, a method has been developed which is for lightening and thinning down an organic EL device by giving gas barrier properties to a light emitting element (organic EL element) including an organic EL material.

Specifically, by adopting a laminate structure (organic EL laminate) obtained by covering a light emitting element, which has an organic EL material, an electrode, and the like on an element substrate, with a passivation film (protective film) having gas barrier properties and attaching a sealing substrate onto the passivation film by using an adhesive, deterioration of the light emitting element due to moisture is prevented.

According to the aforementioned documents, examples of materials forming the passivation film in such an organic EL laminate include inorganic materials such as silicon nitride, silicon oxide, and silicon oxynitride that exhibit gas barrier properties.

Furthermore, according to the aforementioned documents, examples of materials forming the sealing substrate include glass, plastic, quartz, resins, metals, and the like.

If the constitution including the passivation film and the sealing substrate is adopted, the periphery of the organic EL device does not need to be sealed with a metal plate or a glass plate, and therefore the organic EL device can be lightened and thinned down.

In order to further lighten and thin down the organic EL device in a better way, it is more advantageous to use a plastic film than to use glass or the like as the sealing substrate.

In such an organic EL laminate having the sealing substrate, generally, the sealing substrate adheres to the organic EL device (passivation film) by an adhesive.

Meanwhile, a sealant is also known which is for so-called heat sealing by which the sealant material is melted by heating and attaches members to each other as described in JP2008-1760A and JP2011-526052A. As is well known, the surface of the organic EL device has irregularities resulting from the light emitting element formed thereon. If the sealing substrate is heat-sealed by using the aforementioned sealant, it is possible to seal the organic EL device with the sealing substrate while concealing the irregularities on the surface of the organic EL device with the molten sealant.

SUMMARY OF THE INVENTION

As described above, if the organic EL device obtained by covering a light emitting element with a passivation film is sealed with a plastic film as a sealing substrate, the organic EL device can be lightened and thinned down. Furthermore, if the sealant is used for sealing, it is possible to seal the organic EL device with the plastic film while concealing the irregularities on the surface of the organic EL device.

However, according to the examination conducted by the present inventor, if an organic EL device is sealed with a plastic film by using a sealant, various problems occur such as interlayer peeling between the sealant and the plastic film and deterioration of optical characteristics that is caused particularly in a top emission-type organic EL device.

An object of the present invention is to solve the aforementioned problems of the related art and to provide a functional film which is preferable as a sealing substrate of an organic EL device obtained by covering a light emitting element including an organic EL material with a passivation film, can inhibit deterioration of optical characteristics and the like, and can preferably prevent deterioration of the light emitting element due to moisture.

In order to achieve the aforementioned object, the present invention provides a functional film including a support which has a value of retardation of equal to or less than 50 nm; a protective inorganic film which is formed on the support; one or more combinations, each of which is composed of an inorganic film and an organic film that is an underlayer of the inorganic film, formed on the protective inorganic film; and a sealant layer which adheres onto the inorganic film as an uppermost layer by an adhesive layer, in which the sealant layer has a value of retardation of equal to or less than 300 nm and has a glass transition temperature lower than that of the support.

The functional film preferably has a mixed layer, in which a component of the adhesive layer is mixed with a component of the sealant layer, between the adhesive layer and the sealant layer.

The functional film preferably has a second mixed layer, in which a component of the support is mixed with a component of the protective inorganic film, between the support and the protective inorganic film.

The glass transition temperature of the sealant layer is preferably lower than that of the adhesive layer, and the glass transition temperature of the adhesive layer is preferably lower than that of the support and the organic film.

A thickness of the sealant layer is preferably 10 μm to 100 μm, and the adhesive layer is preferably thinner than the sealant layer.

The support and the sealant layer are preferably formed of a same type of material.

At least either the support or the sealant layer is preferably formed of a cycloolefin copolymer.

The adhesive layer preferably contains a silane coupling agent, the inorganic layer formed on top of the combinations is preferably a film of a silicon compound, and at least either an —O group or a —OH group is preferably introduced into the surface of the film of a silicon compound.

Each of the protective inorganic film and the inorganic film is preferably a film of silicon nitride.

According to the functional film of the present invention, it is possible to more preferably prevent deterioration of the light emitting element due to moisture, by sealing the organic EL device (particularly, a top emission-type organic EL device) obtained by covering the light emitting element including an organic EL material with a passivation film, without causing interlayer peeling or deterioration of optical characteristics and the like of the organic EL device.

DESCRIPTION OF THE PREFERRED EMBODIMENTS

Hereinafter, a functional film of the present invention will be specifically described based on preferable examples described in attached drawings.

Figure 1A:
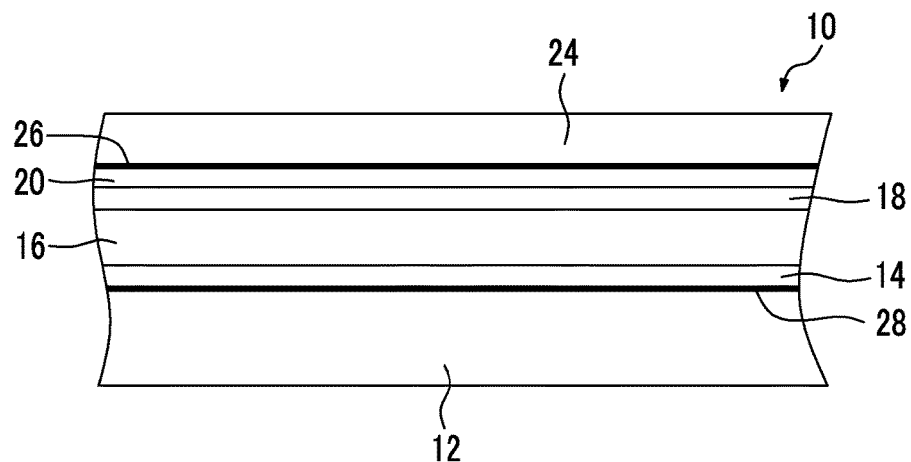
FIGS. 1A and 1B are diagrams schematically showing an example of a functional film.

FIG. 1A schematically shows an example of the functional film of the present invention.

A functional film 10 has a support 12, a protective inorganic film 14 on the support 12, an inorganic film 18, and an organic film 16 that is an underlayer of the inorganic film 18, in which the inorganic film 18 adheres to a sealant layer 24 by an adhesive layer 20. In a preferable embodiment, the functional film 10 has a mixed layer 26, in which a component of the adhesive layer 20 is mixed with a component of the sealant layer 24, between the adhesive layer 20 and the sealant layer 24. Furthermore, in a preferable embodiment, the functional film 10 has a mixed layer 28 (a second mixed layer), in which a component of the support 12 is mixed with a component of the protective inorganic film 14, between the support 12 and the protective inorganic film 14. In the present embodiment, the functional film 10 has the mixed layer 28, the protective inorganic film 14, the organic film 16, the inorganic film 18, the adhesive layer 20, the mixed layer 26, and the sealant layer 24 in this order from the side (the lower side in FIG. 1A) of the support 12.

In the present embodiment, the functional film 10 has one combination composed of the inorganic film 18 and the organic film 16 as the underlayer. However, the functional film 10 is not limited thereto, and may have two or more combinations each of which is composed of the organic film 16 and the inorganic film 18.

Figure 1B:
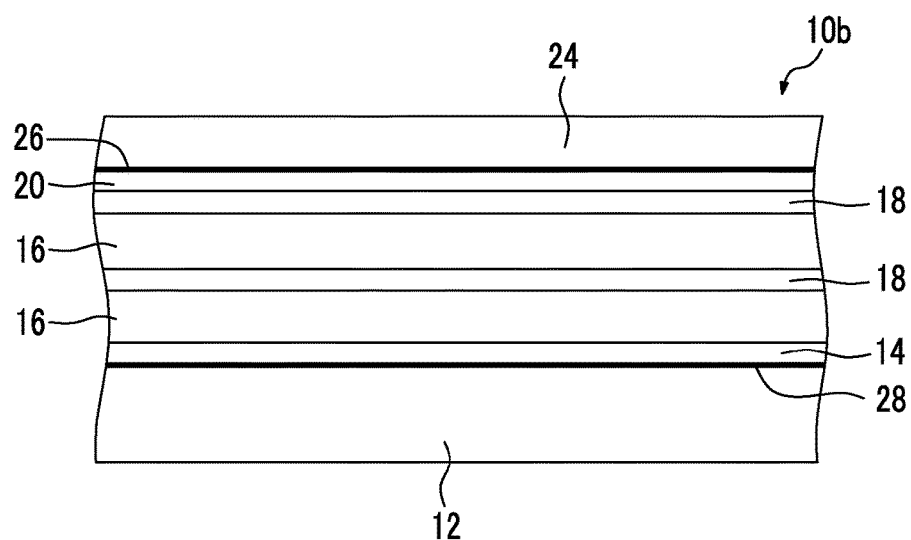

For example, just like a functional film 10b shown in FIG. 1B, the functional film 10 may have two or three or more combinations, each of which is composed of the inorganic film 18 and the organic film 16 as the underlayer. In both the case in which the functional film 10 has one combination composed of the organic film 16 as the underlayer and the inorganic film 18 and the case in which the functional film 10 has a plurality of the combinations, the uppermost layer (a film farthest from the support 12) of the laminated structure composed of the inorganic film 18 and the organic film 16 as the underlayer is the inorganic film 18. The inorganic film 18 as the uppermost layer and the sealant layer 24 adhere to each other by the adhesive layer 20.

Figure 2:
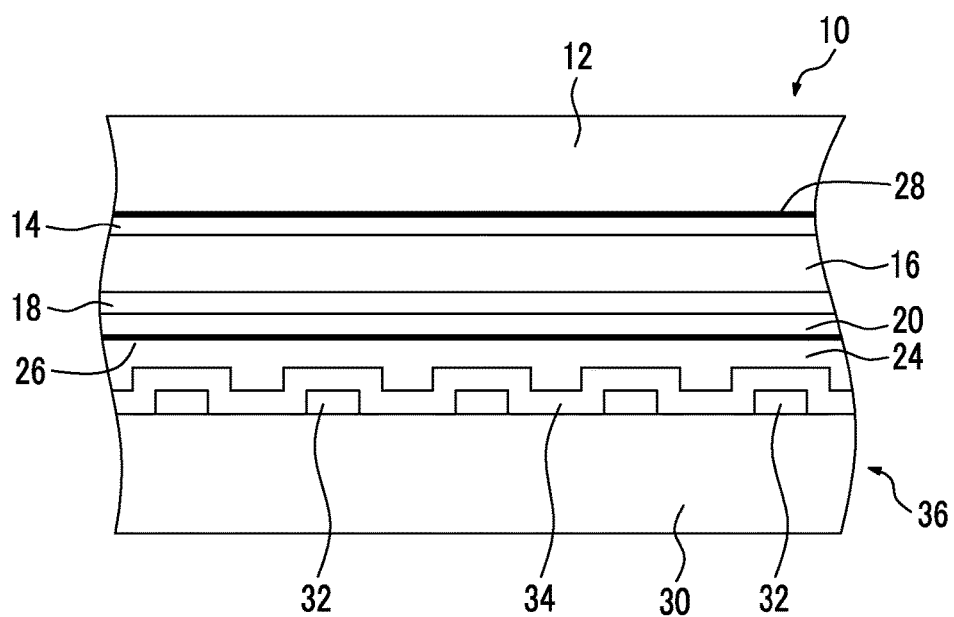
FIG. 2 is a diagram schematically showing an example of an organic EL laminate in which an organic EL device is sealed with the functional film shown in FIG. 1A.

As schematically shown in FIG. 2, the functional film 10 is preferably used as a sealing substrate of an organic EL device 36. The organic EL device 36 has a light emitting element 32 which is formed on an element substrate 30 such as a glass plate and a passivation film 34 which is composed of silicon nitride or the like and covers the light emitting element 32 (and the element substrate 30).

Specifically, as shown in FIG. 2, in the functional film 10, the sealant layer 24 and the passivation film 34 are laminated on each other in a state of facing each other, the sealant layer 24 is melted such that the sealant layer 24 and the passivation film 34 are thermally fused with each other, and in this way, the organic EL device 36 is sealed. As a result, an organic EL laminate is formed in which the organic EL device 36 is sealed with the functional film 10.

The functional film 10 is particularly preferably used as a sealing substrate of a top emission-type organic EL device which emits light toward the side (the side of the passivation film 34) opposite to the element substrate 30.

The support 12 (a substrate or a base material) is a transparent sheet-like substance having a value of retardation of equal to or less than 50 nm. The value of retardation of the support 12 is preferably equal to or less than 20 nm, and more preferably equal to or less than 5 nm. For example, Tg of the support 12 is 160° C. to 180° C.

If the value of retardation of the support 12 exceeds 50 nm, problems occur in that when the top emission-type organic EL device 36 is sealed with the functional film 10 as a sealing substrate, light is used with poor efficiency, and when such an organic EL device 36 is used in an organic EL display, image quality deteriorates, contrast is reduced, and interference fringes are easily visually recognized.

As the support 12, it is possible to use a transparent substance having a value of retardation of equal to or less than 50 nm.

Preferable examples of the support 12 include a plastic film having a value of retardation of equal to or less than 50 nm composed of polycarbonate (PC), a cycloolefin polymer (COP), a cycloolefin copolymer (COC), triacetyl cellulose (TAC), transparent polyimide, or the like.

In the following description, regarding the support 12, a plastic film having a value of retardation of equal to or less than 50 nm is also referred to as a "low retardation film".

In order to reduce the load of the inorganic film 18 and the passivation film 34 which will be described later and to more preferably prevent deterioration of the light emitting element 32 due to moisture or the like, the support 12 preferably has a low moisture transmission rate and contains a small amount of water.

Furthermore, in order to manufacture an organic EL device such as a flexible organic EL display or a flexible organic EL lighting, the support 12 also preferably has excellent flexibility.

Considering the aforementioned points, as the support 12, low retardation films composed of polycarbonate, a cycloolefin polymer, or a cycloolefin copolymer are particularly preferable. Among these, as the support 12, low retardation films composed of a cycloolefin polymer or a cycloolefin copolymer are more preferable. Among these, as the support 12, a low retardation film composed of a cycloolefin copolymer is even more preferable.

A thickness of the support 12 may be appropriately set according to the use or size of the functional film 10. Through examination, the present inventor found that the thickness of the support 12 is preferably about 10 μm to 200 μm. If the thickness of the support 12 is within the aforementioned range, it is preferable because the organic EL laminate (organic EL device) using the functional film 10 as a sealing substrate is lightened and thinned down.

The support 12 may be obtained by forming a film which performs a necessary function, such as an antireflection film, on the surface of the low retardation film exemplified above.

On the surface of the support 12, the protective inorganic film 14 is formed. The protective inorganic film 14 is a film composed of an inorganic compound (a film (layer) containing an inorganic compound as a main component) and protects the support 12 at the time of forming the organic film 16.

Generally, the organic film 16 that is an underlayer of the inorganic film 18 is formed by a so-called coating method or flash vapor deposition. Specifically, the organic film 16 is formed of a coating obtained by dissolving an organic compound in a solvent. In the aforementioned methods, in order to secure covering properties of the coating and to secure smoothness of the surface of the formed film, the coating forming the organic film 16 preferably contains an organic solvent having a low boiling point, such as methyl ethyl ketone (MEK) or methyl isobutyl ketone (MIBK).

Generally, the low retardation film tends to be easily dissolved or altered by an organic solvent. Therefore, if the organic film 16 is formed by the coating method or the like on the surface of the support 12 as the low retardation film, the solvent of the coating may dissolves or alters the surface of the support 12.

Dissolving or altering the surface of the support 12 causes problems such as change in the value of retardation of the support 12, reduction of the light transmittance, and haze increase. As a result, due to these problems, optical characteristics of the functional film 10 deteriorate. That is, even if the low retardation film is used as the support 12, the film cannot sufficiently exert the effect thereof. Consequently, the performance of the organic EL device using the functional film 10 as a sealing substrate deteriorates.

In contrast, in the functional film 10, the protective inorganic film 14 is formed on the surface of the support 12 as the low retardation film, and a combination composed of the organic film 16, which is the underlayer, and the inorganic film 18 is formed on the protective inorganic film 14.

Accordingly, in the functional film 10, even if the organic film 16 is formed by using the low retardation film as the support 12, the deterioration or change of optical characteristics of the support 12 can be prevented. Consequently, the use of the low retardation film as the support 12 exerts a sufficient effect, and accordingly, it is possible to provide the functional film 10 in which the value of retardation of the support 12 does not change (or changes extremely little) and which has a low value of retardation, a high degree of transparency such as a total light transmittance, a low haze, and excellent optical characteristics.

Various inorganic compounds can be used as materials forming the protective inorganic film 14, as long as the compounds can form a film which does not allow an organic solvent to pass through it.

Preferable examples of the materials forming the protective inorganic film 14 include inorganic compounds like metal oxides such as aluminum oxide, magnesium oxide, tantalum oxide, zirconium oxide, titanium oxide, and indium tin oxide (ITO); metal nitrides such as aluminum nitride; metal carbides such as aluminum carbide; oxides of silicon such as silicon oxide, silicon oxynitride, silicon oxycarbide, and silicon oxynitrocarbide; nitrides of silicon such as silicon nitride and silicon nitrocarbide; and carbides of silicon such as silicon carbide. As materials forming the protective inorganic film 14, hydrides of the above inorganic compounds, the above inorganic compounds containing hydrogen, and a mixture of two or more kinds of the aforementioned inorganic compounds are also preferably used.

Particularly, silicon nitride, silicon oxide, silicon oxynitride, and aluminum oxide are preferably used because these compounds have a high degree of transparency and are dense. Among these, silicon nitride is particularly preferably used because it is denser and has a higher degree of transparency.

In order to obtain the functional film 10 having a high degree of gas barrier properties, it is preferable for the protective inorganic film 14 to exhibit gas barrier properties just like the inorganic film 18.

Considering gas barrier properties and productivity, the protective inorganic film 14 is preferably formed of a same type of material as the inorganic film 18 which mainly exhibits gas barrier properties as intended. Furthermore, in order to secure the gas barrier properties and the optical characteristics of the support 12, the protective inorganic film 14 is preferably formed of silicon nitride which makes it possible to obtain a high degree of transparency and a high degree of gas barrier properties.

When the protective inorganic film 14 is formed of a silicon compound, at least either an —O group or a —OH group is preferably introduced into the surface of the protective inorganic film 14. Particularly, a —OH group is preferably introduced into the surface of the protective inorganic film 14. The introduction of the —OH group or the like into the protective inorganic film 14 may be performed in the same manner as in the case of the inorganic film 18 that will be described later.

If an —O group or a —OH group is introduced into the surface of the protective inorganic film 14 as a surface layer, and if the organic film 16 contains a silane coupling agent, the adhesiveness between the protective inorganic film 14 and the organic film 16 can be more preferably secured. This point will be specifically described later by using the inorganic film 18 and the adhesive layer 20 as an example.

In the functional film 10, a thickness of the protective inorganic film 14 may be appropriately set according to the material forming the protective inorganic film 14, such that the coating (organic solvent) forming the organic film 16 can be prevented from reaching the support 12. Through examination, the present inventor found that the thickness of the protective inorganic film 14 is preferably 5 nm to 200 nm. The thickness of the protective inorganic film 14 is more preferably 10 nm to 100 nm.

If the thickness of the protective inorganic film 14 is equal to or greater than 5 nm, it is possible to more reliably prevent the support 12 from dissolving in the coating forming the organic film 16, and the protective inorganic film 14 can exhibit gas barrier properties. As a result, the gas barrier properties can be improved, and the number of the organic film 16 and the inorganic film 18 laminated on each other can be reduced.

If the thickness of the protective inorganic film 14 is equal to or less than 200 nm, it is possible to preferably prevent cracks or fissures from occurring in the protective inorganic film 14. Consequently, the effect of improving gas barrier properties by using the protective inorganic film 14 and the effect of preventing the support 12 from dissolving in the coating of the organic film 16 are more reliably obtained.

The functional film 10 preferably has the mixed layer 28 (the second mixed layer), in which the components of the support 12 and the protective inorganic film 14 are mixed together, between the support 12 and the protective inorganic film 14.

In many cases, the optical characteristics such as a refractive index of the support 12 as the low retardation film are completely different from the optical characteristics of the protective inorganic film 14. If the protective inorganic film 14, which has the optical characteristics completely different from the optical characteristics of the support 12, is directly laminated on the support 12, due to the difference in the optical characteristics between the protective inorganic film 14 and the support 12, the optical characteristics are likely to greatly change between the layers. Therefore, even if the low retardation film having a value of retardation of equal to or less than 50 nm is used as the support 12, the optical characteristics cannot be sufficiently exhibited in some cases.

In contrast, the mixed layer 28, in which the component of the support 12 is mixed with the component of the protective inorganic film 14, has optical characteristics intermediate between the optical characteristics of the support 12 and the protective inorganic film 14. Therefore, between the support 12 and the protective inorganic film 14, the mixed layer 28 functions as a buffering layer that inhibits a drastic change in the optical characteristics such as a refractive index. If the mixed layer 28 is disposed between the support 12 and the protective inorganic film 14, it is possible to obtain the functional film 10 with excellent optical characteristics in which the optical characteristics of the support 12 as the low retardation film are further exhibited.

If the mixed layer 28 is disposed between the support 12 and the protective inorganic film 14, it is possible to preferably prevent the functional film 10 (particularly, the inorganic film 18) from being damaged due to the change in temperature or humidity and to further improve the adhesiveness between the support 12 and the protective inorganic film 14.

Generally, the protective inorganic film 14 composed of an inorganic compound such as silicon nitride is formed by a vapor-phase deposition method such as plasma CVD or sputtering just like the inorganic film 18.

At the time of forming the protective inorganic film 14 by a vapor-phase deposition method, by controlling etching of the support 12 caused by plasma or controlling attraction of ions or the like caused by bias applied to the support 12, the mixed layer 28 can be formed in which the components of the support 12 and the protective inorganic film 14 are mixed together.

A thickness of the mixed layer 28 is preferably 1 nm to 100 nm, more preferably 2 nm to 30 nm, and even more preferably 5 nm to 15 nm.

If the thickness of the mixed layer 28 is less than 1 nm, the effect obtained by forming the mixed layer 28 cannot become sufficient in some cases. Inversely, if the thickness of the mixed layer 28 exceeds 100 nm, the mixed layer 28 becomes too thick, and thus the optical characteristics of the functional film 10 may deteriorate. Furthermore, if the thickness of the mixed layer 28 exceeds 100 nm, cracks, fissures, or the like may occur in the mixed layer 28, and as a result, the gas barrier properties are likely to deteriorate.

For example, the thickness of the mixed layer 28 is measured as below. A cross section of the laminate, in which the protective inorganic film 14 is formed on the surface of the support 12, is observed with a scanning electron microscope or the like so as to measure a distance (distance in a thickness direction) between the lower end (the side of the support 12) of the mixed layer 28 and the upper end thereof. In this way, the thickness of the mixed layer 28 in the cross section is measured. The thickness in the cross section is measured at 10 sites (10 cross sections) randomly selected, and the average of the thicknesses of the mixed layer 28 in the 10 cross sections is taken as the total thickness of the mixed layer 28.

On the protective inorganic film 14, the organic film 16 is formed. The organic film 16 is a film composed of an organic compound (a film (layer) containing an organic compound as a main component). Basically, the organic film 16 is obtained by crosslinking (polymerizing) at least either a monomer or an oligomer. For example, Tg of the organic film 16 is 160° C. to 180° C.

In the functional film 10, the organic film 16 is the underlayer of the inorganic film 18 that mainly exhibits gas barrier properties.

If the functional film 10 has the organic film 16 that is the underlayer of the inorganic film 18, irregularities on the surface of the support 12, foreign substances having adhered to the surface of the support 12, and the like can be embedded in (covered with) the organic film 16, and thus a surface for forming the inorganic film 18 (a film formation surface) can be appropriately prepared. If the organic film 16 is formed, the surface for forming the inorganic film 18 becomes in a state appropriate for forming a film. Consequently, on the entire surface for forming the film, an appropriate inorganic film 18 free of cracks, fissures, or the like can be formed without a void.

If the functional film 10 of the present invention has the laminated structure of an organic film and an inorganic film, a high degree of gas barrier performance can be obtained in which the water vapor transmission rate is less than $1 \times 10^{-4}$ [g/(m²·day)]. That is, if the functional film 10, which has the laminated structure of an organic film and an inorganic film and has a high degree of gas barrier performance, is used as a sealing substrate of an organic EL device, it is possible to preferably prevent the deterioration of the light emitting element 32 due to moisture or the like.

In addition, the organic film 16 that is the underlayer of the inorganic film 18 functions as a cushion for the inorganic film 18. Accordingly, when the organic EL device 36 and the functional film 10 are pressed together so as to adhere to each other, or when the organic EL device 36 receives external impact, due to the cushioning effect of the organic film 16, damage of the inorganic film 18 can be prevented.

As a result, in the organic EL device 36 shown in FIG. 2, the functional film 10 appropriately demonstrates gas barrier performance, and thus the deterioration of the light emitting element 32 due to moisture can be preferably prevented.

Various organic compounds (resins and polymer compounds) can be used as materials forming the organic film 16.

Preferable examples of the materials forming the organic film 16 include thermoplastic resins such as polyester, an acryl resin, a methacryl resin, a methacrylic acid-maleic acid copolymer, polystyrene, a transparent fluorine resin, polyimide, fluorinated polyimide, polyamide, polyamide imide, polyether imide, cellulose acylate, polyurethane, polyether ether ketone, polycarbonate, alicyclic polyolefin, polyarylate, polyether sulfone, polysulfone, fluorene ring-modified polycarbonate, alicyclic-modified polycarbonate, fluorene ring-modified polyester, and an acryloyl compound, polysiloxane, and other organic silicon compounds. A plurality of these materials may be concurrently used.

Among these, as the materials forming the organic film 16, a polymer of either or both of a radically polymerizable compound and a cationically polymerizable compound having an ether group as a functional group is preferable, because such a polymer is excellent in terms of a glass transition temperature, strength, and the like.

Particularly, as the materials forming the organic film 16, an acryl resin or a methacryl resin is more preferable which contains, as a main component, a polymer of a monomer or an oligomer of acrylate and/or methacrylate and has a glass transition temperature of equal to or higher than 120° C., because such a resin has a low refractive index and a high degree of transparency and is excellent in terms of optical characteristics in addition to the strength.

Especially, as the materials forming the organic film 16, an acryl resin or a methacryl resin is even more preferable which contains, as a main component, a polymer of a monomer or an oligomer of acrylate and/or methacrylate having two or more functional groups, particularly, three or more functional groups, such as dipropylene glycol di(meth)acrylate (DPGDA), trimethylolpropane tri(meth)acrylate (TMPTA), and dipentaerythritol hexa(meth)acrylate (DPHA). Furthermore, as the materials forming the organic film 16, a plurality of the acryl resins or methacryl resins is preferably used.

If the organic film 16 is formed of the aforementioned acryl resin or methacryl resin, the inorganic film 18 can be formed on the underlayer having a stable skeleton, and therefore a denser inorganic film 18 having a high degree of gas barrier properties is formed.

A thickness of the organic film 16 is preferably 0.5 μm to 5 μm, and more preferably 1 μm to 3 μm.

If the thickness of the organic film 16 is equal to or greater than 0.5 μm, the surface for forming the inorganic film 18 can be more preferably prepared. Accordingly, an appropriate inorganic film 18 free of cracks, fissures, or the like is formed in a wider range of the surface for forming the film. Furthermore, if the thickness of the organic film 16 is equal to or greater than 0.5 μm, when the organic EL device 36 and the functional film 10 are pressed together so as to adhere to each other, the organic film 16 exerts a sufficient effect as a cushion, and accordingly, damage of the inorganic film 18 can be more reliably prevented.

Moreover, if the thickness of the organic film 16 is equal to or less than 5 μm, it is possible to preferably prevent the problem in that the organic film 16 cracks or the functional film 10 is curled due to the excessive thickness of the organic film 16.

When the functional film has a plurality of organic films 16 just like the gas barrier film shown in FIG. 1B, the thicknesses of the organic films 16 may be the same as or different from each other.

When the functional film has a plurality of organic films 16, the materials forming the organic films 16 may be the same as or different from each other. In view of productivity and the like, it is preferable that all of the organic films 16 are formed of a same type of material.

The organic film 16 may be formed by a coating method, flash vapor deposition, or the like.

In order to improve the adhesiveness with respect to the protective inorganic film 14, the organic film 16 preferably contains a silane coupling agent. If the protective inorganic film 14 is formed of a silicon compound; if a —OH group or the like is introduced into the surface of the protective inorganic film 14; and if the organic film 16 contains a silane coupling agent, the adhesiveness between the protective inorganic film 14 and the organic film 16 can be secured by the same mechanism as described later regarding the adhesiveness between the inorganic film 18 and the adhesive layer 20.

The inorganic film 18 is formed on the organic film 16 which functions as an underlayer of the inorganic film 18.

The inorganic film 18 is a film formed of an inorganic compound (film (layer) containing an inorganic compound as a main component), and mainly exhibits gas barrier properties in the functional film 10.

In the laminated structure composed of the organic film 16 and the inorganic film 18, the uppermost layer is the inorganic film 18, and the inorganic film 18 as the uppermost layer and the sealant layer 24 adhere to each other by the adhesive layer 20.

As the inorganic film 18, it is possible to use various films composed of an inorganic compound that exhibits gas barrier properties.

Preferable examples of the inorganic film 18 include films composed of the inorganic compounds exemplified above for the protective inorganic film 14. Particularly, films composed of a silicon compound are preferable because such a film has a high degree of transparency and can exhibit excellent gas barrier properties. Particularly, a film composed of silicon nitride is preferable because such a film has better gas barrier properties and a high degree of transparency.

When the functional film has a plurality of inorganic films 18 just like the functional film 10b shown in FIG. 1B, the materials forming the inorganic films 18 may be different from each other. Considering productivity and the like, it is preferable that all the inorganic films 18 are formed of a same type of material.

The inorganic film 18 and the protective inorganic film 14 may be formed of different materials. Considering productivity and the like, it is preferable that the inorganic film 18 and the protective inorganic film 14 are formed of a same type of material.

When the inorganic film 18 is formed of a silicon compound, at least either an —O group or a —OH group is preferably introduced into the surface of the inorganic film 18 as the uppermost layer, and a —OH group is particularly preferably introduced into the surface of the inorganic film 18. Especially, it is preferable that the inorganic film 18 as the uppermost layer is formed of a silicon nitride, and at least either an —O group or a —OH group, particularly, a —OH group is preferably introduced into the surface of the inorganic film 18.

If an —O group or a —OH group is introduced into the surface of the inorganic film 18 as the surface layer, and if the adhesive layer 20 contains a silane coupling agent, the adhesiveness between the inorganic film 18 and the adhesive layer 20 can be more preferably secured. This point will be specifically described later.

A thickness of the inorganic film 18 may be appropriately determined according to the material forming the inorganic film 18, such that intended gas barrier properties can be exhibited. Through examination, the present inventor found that the thickness of the inorganic film 18 is preferably 10 nm to 200 nm. The thickness of the inorganic film 18 is preferably 10 nm to 100 nm, and more preferably 20 nm to 75 nm.

If the thickness of the inorganic film 18 is equal to or greater than 10 nm, it is possible to form the inorganic film 18 that stably demonstrates sufficient gas barrier performance. Generally, the inorganic film 18 is brittle. Therefore, if the inorganic film 18 is too thick, cracks, fissures, peeling, and the like are likely to occur in the inorganic film 18. Therefore, if the thickness of the inorganic film 18 is equal to or less than 200 nm, it is possible to prevent the occurrence of cracks.

When the functional film has a plurality of inorganic films 18 just like the functional film 10b shown in FIG. 1B, the thicknesses of the inorganic films 18 may be the same as or different from each other.

It is preferable that the functional film 10 has a water vapor transmission rate of $1 \times 10^{-4}$ [g/(m²·day)] before the adhesive layer 20 and the sealant layer 24 are formed.

If the functional film 10 is constituted as above, it is possible to more preferably prevent the light emitting element 32 of the organic EL device 36, which uses the functional film 10 as a sealing substrate, from deteriorating due to moisture.

The inorganic film 18 can be formed by a known method. Preferable examples of the method for forming the inorganic film 18 include vapor-phase deposition methods (vapor-phase film deposition methods) like plasma CVD such as CCP-CVD or ICP-CVD, sputtering such as magnetron sputtering or reactive sputtering, and vacuum vapor deposition.

In a film formed of a silicon compound by a vapor-phase deposition method, not all the silicon atoms in the film form a target compound such as silicon nitride, and there are silicon atoms having direct bonds that have not participated in bonding. Particularly, the surface of the film has a large amount of silicon atoms having direct bonds that have not participated in bonding. Accordingly, if the surface of the film is exposed to the air (atmosphere) after the inorganic film 18 is formed, an —O group or a —OH group is bonded to the direct bonds that have not participated in bonding. As a result, an —O group or a —OH group (particularly a —OH group) is introduced into the surface of the inorganic film 18 as described above.

The sealant layer (heat sealing layer) 24 adheres onto the inorganic film 18 by the adhesive layer 20.

By the sealant layer 24, the functional film 10 adheres to the organic EL device 36 (passivation film 34) or the like by means of heat sealing (or thermal sealing).

The sealant layer 24 has a value of retardation of equal to or less than 300 nm and is formed of a material having a glass transition temperature (Tg) lower than that of the support 12.

As described above, the functional film 10 has the protective inorganic film 14 on the support 12 which is a low retardation film, and has a laminated structure of an organic film and an inorganic film, which is composed of the inorganic film 18 and the organic film 16 as the underlayer, on the protective inorganic film 14. That is, in the functional film 10, by the adhesive layer 20, the sealant layer 24 with a low retardation value adheres onto the gas barrier film having the laminated structure of an organic film and an inorganic film that has a low retardation value, excellent optical characteristics, and excellent gas barrier properties.

In recent years, it has been increasingly required for organic EL devices to be lightened and thinned down. In addition, depending on the use thereof, it has been required for organic EL devices to have flexibility such that they can be folded or bent. Considering the request to lightening and thinning down of the organic EL device, it is advantageous to use a plastic film as the sealing substrate sealing the organic EL device 36.

In contrast, as shown in FIG. 2, if the organic EL device 36 is sealed with the functional film 10 used as a sealing substrate, the organic EL laminate can be further lightened and thinned down compared to the organic EL laminate of the related art using a glass plate or the like as a sealing substrate. When the functional film 10 is used as a sealing substrate, the organic EL laminate can be lightened and thinned down to the same extent as in the case of using a plastic film as a sealing substrate.

Because the functional film 10 adheres to the organic EL device 36 by means of heat sealing using the sealant layer 24, the molten sealant layer 24 follows the irregularities of the organic EL device 36 (passivation film 34). Therefore, the functional film 10 can preferably seal the organic EL device 36 by concealing the irregularities of the organic EL device 36. Furthermore, due to the anchoring effect resulting from the irregularities on the surface of the organic EL device 36, the adhesiveness between the functional film 10 and the organic EL device 36 is secured.

The functional film 10 has low retardation films, which are the support 12 and the sealant layer 24, and has the protective inorganic film 14. Therefore, when the organic EL device 36 is sealed with the functional film 10, negative influences that the functional film 10 exerts on the optical characteristics of the organic EL device 36 are suppressed. As a result, it is possible to manufacture an organic EL device having excellent optical characteristics, such as an organic EL display having high image quality.

The functional film 10 adheres to the organic EL device 36 or the like by means of heat sealing. At this time, the sealant layer 24 of the functional film 10 is melted and then solidified again. It is considered that at this time, the temperature of the sealant layer 24 becomes equal to or higher than Tg thereof, and as a result, the sealant layer 24 attaches the functional film 10 to the organic EL device 36 without being stretched. Consequently, the value of retardation is reduced, and an organic EL laminate having better optical characteristics is formed.

The functional film 10 has a laminated structure of an organic film and an inorganic film and demonstrates high gas barrier performance in which the water vapor transmission rate becomes less than $1 \times 10^{-4}$ [g/(m²·day)]. Accordingly, if the functional film 10 is used as a sealing substrate, it is possible to more preferably prevent the light emitting element 32 of the organic EL device 36 from deteriorating due to moisture.

Tg of the sealant layer 24 is lower than Tg of the support 12. Therefore, at the time of heat sealing, the support 12 can maintain its strength. Consequently, the inorganic film 18 or the like can be prevented from being damaged due to the deformation or the like of support 12, and the functional film 10 can appropriately demonstrate excellent gas barrier performance. Furthermore, because Tg of the sealant layer 24 is lower than Tg of the support 12, the functional film 10 can adhere to the organic EL device 36 by means of heat sealing at a lower temperature.

The sealant layer 24 is a sheet-like substance which has a value of retardation of equal to or less than 300 nm and has Tg lower than Tg of the support 12. For example, Tg of the sealant layer 24 is 40° C. to 90° C.

The functional film 10 is preferably used for sealing a top emission-type organic EL device. Therefore, if the value of retardation of the sealant layer 24 exceeds 300 nm, the same problems as described above regarding the support 12 occur such as the reduction in light usage efficiency or deterioration of image quality of an organic EL display.

Considering the aforementioned point, the value of retardation of the sealant layer 24 is preferably equal to or less than 200 nm, more preferably equal to or less than 150 nm, even more preferably equal to or less than 100 nm, and particularly preferably equal to or less than 50 nm.

As the sealant layer 24, it is possible to use a film having a value of retardation within the aforementioned range and having Tg lower than Tg of the support 12.

Specifically, examples of the film preferable as the sealant layer 24 include plastic films which are formed of materials with low Tg among the materials exemplified above for the support 12 that form a low retardation film, and have a value of retardation of equal to or less than 300 nm. Examples of the film preferable as the sealant layer 24 also include plastic films which are obtained by mixing the aforementioned materials with various components (for example, polyethylene (PE) and the like), formed of materials with low Tg, and have a value of retardation of equal to or less than 300 nm.

Hereinafter, for convenience, regarding the sealant layer 24, a plastic film having a value of retardation of equal to or less than 300 nm will be referred to as a "low retardation film" in some cases.

For the same reason as applied to the support 12, the sealant layer 24 is particularly preferably a low retardation film composed of polycarbonate having low Tg (with low Tg), a cycloolefin polymer having low Tg, or a cycloolefin copolymer having low Tg, or a low retardation film composed of a material with low Tg mixed with the aforementioned materials. Among these, either a low retardation film composed of a cycloolefin polymer with low Tg or a cycloolefin copolymer with low Tg or a low retardation film composed of a material with low Tg mixed with the aforementioned materials is preferable as the sealant layer 24. Especially, among these, either a low retardation film composed of a cycloolefin copolymer with low Tg or a low retardation film composed of a material with low Tg mixed with the cycloolefin copolymer with low Tg is preferable as the sealant layer 24, for example.

In the functional film 10, it is preferable that the support 12 and the sealant layer 24 are formed of a same type of material. For example, when the support 12 is formed of a cycloolefin-based material (for example, a cycloolefin copolymer (COC) or a cycloolefin polymer (COP)), it is preferable that the sealant layer 24 is also formed of a cycloolefin-based material (COC or COP). Furthermore, for example, it is preferable that both the support 12 and the sealant layer 24 are formed of either polycarbonate (PC) material or a cellulose-based material (for example, triacetyl cellulose (TAC)).

If the support 12 and the sealant layer 24 are formed of a same type of material, it is possible to inhibit the respective layers (films) in the functional film 10 from being deformed to different degrees due to moisture permeating the films. Consequently, in preventing the inorganic film 18 (protective inorganic film 14) from being broken due to deformation in a hot and humid environment, preferable results can be obtained.

Although Tg of the sealant layer 24 is preferably lower than Tg of the support 12, it is preferable for a difference in Tg between the sealant layer 24 and the support 12 to be great. Specifically, Tg of the sealant layer 24 is lower than Tg of the support 12, preferably by at least 50° C., and particularly preferably by at least 80° C.

If the difference in Tg between the sealant layer 24 and the support 12 is as above, when the organic EL device 36 is sealed with the functional film 10, the support 12 can more reliably maintain strength against deformation caused by heating. Accordingly, it is possible to more preferably prevent the inorganic film 18 from being damaged due to the deformation of the support 12 and to reduce the temperature at the time of heat sealing.

It is preferable that the sealant layer 24 has gas barrier properties in which a water vapor transmission rate measured based on, for example, JIS Z 0208 in an environment of 60° C. and 90% RH is less than 50 $[g/(m^2 \cdot day)]$ expressed in terms of a water vapor transmission rate of the sealant layer having a thickness of 100 μm.

The moisture which permeates the organic EL device 36 from the edge of the sealant layer 24 and the outgas from the adhesive layer 20 and the mixed layer 26 are assumed to cause the deterioration of the light emitting element 32 after the organic EL device 36 is sealed. Particularly, the outgas from the adhesive layer 20 and the mixed layer 26 is present in a space between the inorganic film 18 having gas barrier properties and the passivation film 34. Therefore, the outgas is likely to exert a serious negative influence on the light emitting element 32 without being discharged at the time of heat sealing.

In contrast, if the water vapor transmission rate of the sealant layer 24 is less than 50 $[g/(m^2 \cdot day)]$, the light emitting element 32 is preferably prevented from deteriorating due to the moisture permeating the organic EL device 36 from the edge of the sealant layer 24 or the outgas from the adhesive layer 20 and the mixed layer 26.

If the sealant layer 24 is too thick, the moisture causing the deterioration of the light emitting element 32 easily permeates the organic EL device 36 from the edge of the sealant layer 24. Meanwhile, when the organic EL device 36 is sealed with the functional film 10, the sealant layer 24 needs to sufficiently conceal the irregularities on the surface of the organic EL device 36 and to function as a cushion for preventing the inorganic film 18 from being damaged due to the irregularities. Therefore, the sealant layer 24 needs to have somewhat of a thickness.

Considering the aforementioned points, the thickness of the sealant layer 24 is preferably 5 μm to 100 μm, and more preferably 10 μm to 70 μm.

Various adhesives can be used as the adhesive layer 20, as long as the adhesives can attach the inorganic film 18 to the sealant layer 24 and do not exert a negative influence on the optical characteristics of the functional film 10. For example, Tg of the adhesive layer 20 is 120° C. to 150° C.

Specifically, examples of the adhesives used as the adhesive layer 20 include an epoxy resin, an acryl resin, a urethane resin, and the like. Among these, as the adhesive layer 20, in view of optical characteristics and the like, an acryl resin adhesive is preferably used.

Furthermore, as the adhesive layer 20, an adhesive that releases a small amount of outgas is preferably used, and an adhesive that does not release outgas is more preferably used.

The adhesive layer 20 preferably contains a silane coupling agent. Furthermore, it is preferable that either or both of an —O group and a —OH group are introduced into the surface of the inorganic film 18 that adheres to the sealant layer 24 by the adhesive layer 20.

If the above constitution is adopted, the adhesion between the adhesive layer 20 and the inorganic film 18 can be further improved.

The silane coupling agent is a compound in which a hydrolyzable group such as an alkoxy group and an organic functional group such as an amino group that is expected to react or interact with an organic substance are bonded to silicon.

The hydrolyzable group in the silane coupling agent becomes a —OH group through hydrolysis, dehydrocondensation occurs between the —OH group and a —OH group on the surface of an inorganic compound, and as a result, a strong covalent bond is formed between the silane coupling agent and the surface of the inorganic compound. Furthermore, the organic functional group in the silane coupling agent is copolymerized with an organic compound, and thus a strong bond is formed between the silane coupling agent and the organic compound. In this way, the silane coupling agent improves the adhesiveness between an organic substance and an inorganic substance.

Through examination, the present inventor found that when the inorganic film 18 is a silicon compound, if an —O group, preferably, a —OH group is introduced into the surface thereof so as to create a state similar to "SiOH", the hydrolysis reaction and dehydrocondensation of the silane coupling agent contained in the adhesive layer 20 preferably occur.

If the —OH group or the like is introduced into the surface of the inorganic film 18, the —OH group or the like is released from the surface of the inorganic film 18. Due to the released —OH group or the like, the hydrolysis reaction of the silane coupling agent occurs, and the silicon compound and the silane coupling agent are bonded to each other through a covalent bond formed by the dehydrocondensation. As a result, the adhesion between the adhesive layer 20 and the inorganic film 18 is further improved.

Generally, when the silane coupling agent is used, the pH is adjusted by adding a pH regulator (an acid or an alkali) to the adhesive. However, if the pH regulator is added to the adhesive containing the silane coupling agent, a problem occurs in that viscosity of the adhesive increases due to hydrolysis that proceeds due to the humidity of the atmosphere or water supplied from an organic solvent.

In contrast, if the adhesive layer 20 contains the silane coupling agent, and an —O group or a —OH group is introduced into the surface of the inorganic film 18 composed of a silicon compound, even though the pH is not regulated by adding the pH regulator, a strong adhesion is obtained. That is, according to such a constitution, it is possible not to add the pH regulator, which may cause a problem, to the adhesive layer 20.

Similarly to the sealant layer 24, if the adhesive layer 20 is too thick, moisture permeates the organic EL device 36 from the edge of the adhesive layer 20, and the light emitting element 32 is likely to deteriorate due to the moisture. Furthermore, if the adhesive layer 20 is thick, the amount of gas (outgas) such as moisture released from the adhesive layer 20 is increased, and the outgas is likely to deteriorate the organic EL device 36. Therefore, as long as the inorganic film 18 can adhere to the sealant layer 24, it is preferable that the adhesive layer 20 is as thin as possible.

Specifically, it is preferable that the adhesive layer 20 is thinner than the sealant layer 24. Consequently, a thickness of the adhesive layer 20 is preferably equal to or less than 10 μm, and particularly preferably equal to or less than 5 μm.

In the functional film 10, Tg of the sealant layer 24 is lower than Tg of the support 12. Tg of the sealant layer 24 is preferably lower than Tg of the adhesive layer 20. Furthermore, Tg of the adhesive layer 20 is preferably lower than Tg of the support 12 and Tg of the organic film 16. Tg of the sealant layer 24 is lower than Tg of the adhesive layer 20, preferably by at least 60° C., and more preferably by at least 80° C. Tg of the adhesive layer 20 is lower than Tg of the support 12 (and the organic film 16), preferably by at least 30° C., and more preferably by at least 40° C.

If the aforementioned constitution is adopted, even if the sealant layer 24 is deformed when the functional film 10 is thermally fused, it is possible to inhibit the inorganic film 18 from being deformed as well by using the adhesive layer 20. Furthermore, even if the sealant layer 24 (adhesive layer 20) is deformed when the functional film 10 is thermally fused, the inorganic film 18 (protective inorganic film 14) can be supported by the organic film 16 and the support 12. Accordingly, if the aforementioned constitution is adopted, it is possible to preferably prevent the inorganic film 18 from being deformed along the deformation of the sealant layer 24 when the functional film 10 is thermally fused.

It is preferable that the adhesive layer 20 has a high degree of ductility. Specifically, a pencil hardness of the adhesive layer 20 is preferably equal to or less than 3H and is preferably lower than a pencil hardness of the organic film 16.

If the aforementioned constitution is adopted, the adhesive layer 20 can be prevented from hindering the flowing of the sealant layer 24 when the functional film 10 is thermally fused, and heat sealing can be more reliably performed. Moreover, even if the adhesive layer 20 is deformed at the time of heat sealing, because the organic film 16 supports the inorganic film 18, damage of the inorganic film 18 can be more reliably prevented.

In a preferable embodiment, the functional film 10 has the mixed layer 26, in which the component of the adhesive layer 20 is mixed with the component of the sealant layer 24, between the adhesive layer 20 and the sealant layer 24.

The sealant layer 24 is a low retardation film having a value of retardation of equal to or less than 300 nm. Furthermore, in many cases, the optical characteristics such as a refractive index of the sealant layer 24 are completely different from the optical characteristics of the adhesive layer 20. If the adhesive layer 20 which has completely different optical characteristics is directly laminated on the sealant layer 24, due to the difference in the optical characteristics and the like, the optical characteristics are likely to greatly change between the layers. Therefore, even if the low retardation film having a value of retardation of equal to or less than 300 nm is used as the sealant layer 24, the optical characteristics cannot be sufficiently exhibited in some cases.

In contrast, the mixed layer 26, in which the component of adhesive layer 20 is mixed with the component of the sealant layer 24, has optical characteristics intermediate between the optical characteristics of the adhesive layer 20 and the sealant layer 24. Therefore, between the adhesive layer 20 and the sealant layer 24, the mixed layer 26 functions as a buffering layer that inhibits a drastic change in the optical characteristics such as a refractive index. Accordingly, if the mixed layer 26 is disposed between the adhesive layer 20 and the sealant layer 24, it is possible to obtain the functional film 10 with excellent optical characteristics in which the optical characteristics of the sealant layer 24 as the low retardation film are further exhibited.

If the mixed layer 26 is disposed between the adhesive layer 20 and the sealant layer 24, it is possible to improve the adhesion between the adhesive layer 20 and the sealant layer 24, and to more preferably prevent interlayer peeling that occurs between both the layers. Furthermore, if the mixed layer 26 is disposed between the adhesive layer 20 and the sealant layer 24, the adhesive layer 20 can maintain adhesion by being preferably deformed along with the deformation of the sealant layer 24 caused when the heat sealing is performed, and it is possible to prevent the inorganic film 18 from being damaged by being deformed along the deformation of the sealant layer 24.

For example, the mixed layer 26 is formed in a manner in which the inorganic film 18 is coated with an adhesive (coating) that will become the adhesive layer 20; the sealant layer 24 (a low retardation film that will become the sealant layer 24) is laminated thereon; the sealant layer 24 is then heated to a temperature higher than Tg of the sealant layer 24 before the adhesive is cured, and the adhesive is cured while the sealant layer 24 is being melted.

The melting of the sealant layer 24 for forming the mixed layer 26 just needs to be performed for a short time. For example, the melting may be performed for about 1 second to 60 seconds.

The mixed layer 26 exerts the aforementioned effects even if it is extremely thin. However, it is preferable that the mixed layer 26 has such a thickness that does not exert an influence on the optical characteristics of the functional film 10. A thickness of the mixed layer 26 is preferably about 5 nm to 100 nm, and particularly preferably is about 10 nm to 50 nm.

The thickness of the mixed layer 26 may be measured by the same method as described above for the mixed layer 28.

The value of retardation of the functional film 10 as a complete laminate including the sealant layer 24 is preferably equal to or less than 300 nm, more preferably equal to or less than 100 nm, and particularly preferably equal to or less than 50 nm.

If the aforementioned constitution is adopted, when the top emission-type organic EL device 36 is sealed with the functional film 10, it is possible to more stably manufacture a high-quality organic EL display or the like in which a reduction in light usage efficiency, deterioration of image quality, and the like are inhibited.

The functional film 10 can be manufactured by the following film forming method or the like.

For example, first, by plasma CVD, the protective inorganic film 14 is formed on the surface of a low retardation film which will become the support 12. Thereafter, by a coating method, the organic film 16 is formed on the protective inorganic film 14, and then the inorganic film 18 is formed on the organic film 16 by plasma CVD. At the time of forming the protective inorganic film 14, it is preferable to form the mixed layer 28 (the second mixed layer) in which the component of the support 12 is mixed with the component of the protective inorganic film 14.

Subsequently, the surface of the inorganic film 18 is coated with an adhesive, and a low retardation film that will become the sealant layer 24 is laminated thereon. If necessary, in a state in which the laminate is being pressed, the adhesive is cured by being irradiated with ultraviolet rays or by being heated. By the adhesive layer 20, the inorganic film 18 adheres to the sealant layer 24, thereby forming the functional film 10.

For attaching the inorganic film 18 to the sealant layer 24, in a state in which the adhesive has not yet been cured, the sealant layer 24 is heated to a temperature equal to or higher than Tg of the sealant layer 24, such that the sealant layer 24 is melted and adheres to the inorganic film 18. As a result, the mixed layer 26 is formed between the adhesive layer 20 and the sealant layer 24.

For manufacturing the functional film 10, so-called Roll to Roll (RtoR) may be used in at least one or more steps of forming the protective inorganic film 14, forming the organic film 16, forming the inorganic film 18, forming the adhesive layer 20, and laminating the sealant layer 24.

Furthermore, the step of laminating the sealant layer 24 by means of RtoR may include one or more steps of coating with an adhesive that will become the adhesive layer 20, curing the adhesive, and forming the mixed layer 26.

RtoR is a manufacturing method in which a long substrate to be treated is continuously wound off from a substrate roll, around which the substrate to be treated is wound in the form of a roll, and transported in a longitudinal direction; formation of the respective films, attachment of the sealant layer 24, and the like are performed while the substrate is being transported; and the substrate to be treated that has been treated is rewound in the form of a roll. If RtoR is used, the functional film 10 can be manufactured with excellent production efficiency.

When the functional film 10 is manufactured by using RtoR, all the treatments may be performed while the substrate to be treated is being wound off and rewound once. Alternatively, the formation of the respective film, the attachement of the sealant layer 24, and the like may be performed separately while the substrate to be treated is being wound off and rewound plural times. Otherwise, the formation of the organic film 16 and the formation of the inorganic film 18 may be performed while the substrate to be treated is being wound off and rewound once. That is, one or more treatments appropriately selected may be performed while the substrate to be treated is being wound off and rewound once.

The functional film 10 may be manufactured not only by RtoR but also by a so-called batch type manufacturing method in which the respective films are formed on the support 12 in the form of a cut sheet.

Next, a method for sealing the organic EL device 36 with the functional film 10 used as a sealing substrate will be described.

First, in a state in which the passivation film 34 faces the sealant layer 24, the functional film 10 is laminated on the organic EL device 36.

Thereafter, the functional film 10 is heated from the side of the support 12 such that the sealant layer 24 is heated to a temperature equal to or higher than Tg thereof, thereby melting the sealant layer 24. The functional film 10 is then pressed against the organic EL device 36, and the functional film 10 and the organic EL device 36 are subjected to heat sealing, thereby forming an organic EL laminate.

In the functional film 10, the protective inorganic film 14 is on the surface of the support 12, the support 12 has a value of retardation of equal to or less than 50 nm, the sealant layer 24 has a value of retardation of equal to or less than 300 nm, and Tg of the support 12 is higher than Tg of the sealant layer 24. Accordingly, the inorganic film 18 is inhibited from being damaged due to the flowing of the sealant layer 24 at the time of heating sealing. Furthermore, in the organic EL laminate obtained after sealing, deterioration of the optical characteristics of the organic EL device 36 is prevented.

Hitherto, the functional film of the present invention has been specifically described. However, the present invention is not limited to the aforementioned examples, and within a scope that does not depart from the gist of the present invention, the present invention may be improved or modified in various ways.

EXAMPLES

Hereinafter, the present invention will be more specifically described based on specific examples of the present invention.

Example 1

As the support 12, a COP film (Arton film manufactured by JSR Corporation) having a thickness of 100 μm, a width of 1,000 mm, and a length of 50 m was prepared.

The support 12 had a value of retardation of 3 nm and Tg of 135° C.

The support 12 was loaded in a general plasma CVD apparatus, and by plasma CVD (CCP-CVD), the protective inorganic film 14 having a thickness of 25 nm composed of silicon nitride was formed.

As raw material gases, silane gas ($SiH_4$), ammonia gas ($NH_3$), nitrogen gas ($N_2$), and hydrogen gas ($H_2$) were used. The silane gas was supplied in an amount of 100 sccm, the ammonia gas was supplied in an amount of 200 sccm, the nitrogen gas was supplied in an amount of 500 sccm, and the hydrogen gas was supplied in an amount of 500 sccm. The formation pressure (pressure for forming a film) was 50 Pa.

For plasma excitation, a power of 3,000 W was supplied at a frequency of 13.56 MHz. During the formation of the film, a bias power of 500 W was supplied to the side of the support 12 (substrate holder) at a frequency of 400 kHz.

After being cooled to room temperature, the support 12, on which the protective inorganic film 14 was formed, was taken out of the plasma CVD apparatus. Subsequently, by a coating method, the organic film 16 having a thickness of 2 μm was formed on the surface of the protective inorganic film 14.

The coating for forming the organic film 16 was prepared by adding trimethylolpropane triacrylate (TMPTA, manufactured by Daicel-Cytec Company Ltd.), a surfactant (BYK 378 manufactured by BYK Japan K.K), a photopolymerization initiator (Irg 184 manufactured by Ciba Specialty Chemicals Corporation), and a silane coupling agent (KBM 5103 manufactured by Shin-Etsu Silicones) to methyl ethyl ketone (MEK).

The amount of the surfactant added was 1% by mass expressed in terms of the concentration excluding MEK, the amount of the photopolymerization initiator added was 2% by mass expressed in terms of the concentration excluding MEK, and the amount of the silane coupling agent added was 10% by mass expressed in terms of the concentration excluding MEK. A solid content concentration of the coating, which was obtained by diluting the components in MEK, was 15% by mass.

The surface of the support 12, on which the protective inorganic film 14 was formed, was coated with the coating by using a die coater. Thereafter, the coating was dried by dry air with a temperature of 80° C. The dried coating was polymerized by being irradiated with ultraviolet rays, thereby forming the organic film 16.

The support 12 on which the organic film 16 was formed was loaded again in the aforementioned plasma CVD apparatus. By means of plasma CVD (CCP-CVD), the inorganic film 18 having a thickness of 50 nm composed of silicon nitride was formed.

The inorganic film 18 was formed by using the same raw material gases as those used for forming the aforementioned protective inorganic film 14, under the same conditions as those used for forming the protective inorganic film 14.

The laminate in which the protective inorganic film 14, the organic film 16, and the inorganic film 18 were formed on the support 12 was cut out in the form of a 100 mm×100 mm sheet.

An adhesive (a coating that would become the adhesive layer 20) was prepared by adding two kinds of epoxy resins (JER 1001 and JER 152 manufactured by Japan Epoxy Resins Co., Ltd.), a photopolymerization initiator (Irg 184 manufactured by Ciba Specialy Chemicals Corporation), and a silane coupling agent (KBM 502 manufactured by Shin-Etsu Silicones) to MEK.

The amount of each of the two kinds of epoxy resins added was 47% by mass expressed in terms of the concentration excluding MEK; the amount of the photopolymerization initiator added was 2% by mass expressed in terms of the concentration excluding MEK; and the amount of the silane coupling agent added was 4% by mass expressed in terms of the concentration excluding MEK. A solid content concentration of the coating, which was obtained by diluting the components in MEK, was 50% by mass.

As the sealant layer 24, COC and PE (LLDPE) were mixed together, thereby preparing a 100 m×100 mm film having a thickness of 50 μm.

The sealant layer 24 had a value of retardation of 100 nm and Tg of 50° C.

The surface of the inorganic film 18 of the laminate in the form of a cut sheet was coated with the prepared adhesive by using a bar coater. The surface of the inorganic film 18 was coated with the adhesive such that the thickness of the adhesive layer 20 became 10 μm. Thereafter, the adhesive was dried for 1 minute in an oven at 100° C.

The sealant layer 24 was laminated on the dried adhesive. The adhesive was then cured by being irradiated with ultraviolet rays, and as a result, the inorganic film 18 adhered to the sealant layer 24 by the adhesive layer 20. In this way, the functional film 10 was prepared.

While the adhesive was being cured, the functional film 10 was heated from the side of the support 12 on a hot plate such that the temperature of the support 12 was kept at 80° C. for 30 seconds.

A cross section of the prepared functional film 10 was observed by using a scanning electron microscope (SEM). As a result, it was verified that the mixed layer 28 having a thickness of 25 nm was formed between the support 12 and the protective inorganic film 14, and the mixed layer 26 having a thickness of 30 nm was formed between the adhesive layer 20 and the sealant layer 24. Herein, the thickness of each of the mixed layers was measured by the same method as described above.

Example 2

The functional film 10 was prepared in the same manner as in Example 1, except that the bias power was not supplied to the side of the support 12 at the time of forming the protective inorganic film 14.

A cross section of the functional film 10 was observed in the same manner as in Example 1. As a result, it was verified that although a region, in which the components of the support 12 and the protective inorganic film 14 were mixed together, was observed to be scattered between the support 12 and the protective inorganic film 14, a clear mixed layer 28 was not formed.

Example 3

The functional film 10 was prepared in the same manner as in Example 1, except that a bias power of 300 W was supplied to the side of the support 12 at the time of forming the protective inorganic film 14.

A cross section of the functional film 10 was observed in the same manner as in Example 1. As a result, it was verified that the mixed layer 28 having a thickness of 10 nm was formed between the support 12 and the protective inorganic film 14.

Example 4

The functional film 10 was prepared in the same manner as in Example 1, except that the functional film 10 was not heated while the coating (adhesive) that would become the adhesive layer 20 was being cured.

A cross section of the functional film 10 was observed in the same manner as in Example 1. As a result, it was verified that the mixed layer 26 was not formed between the adhesive layer 20 and the sealant layer 24.

Example 5

The functional film 10 was prepared in the same manner as in Example 1, except that the functional film 10 was heated while the coating (adhesive) that would become the adhesive layer 20 was being cured, such that the temperature of the support 12 was kept at 60° C.

A cross section of the functional film 10 was observed in the same manner as in Example 1. As a result, it was verified that the mixed layer 26 having a thickness of 20 nm was formed between the adhesive layer 20 and the sealant layer 24.

Comparative Example 1

A functional film was prepared in the same manner as in Example 1, except that the sealant layer 24 was changed to a COP film (Arton film manufactured by JSR Corporation) having a thickness of 100 μm.

The sealant layer 24 had a value of retardation of 5 nm and Tg of 142° C.

Comparative Example 2

A functional film was prepared in the same manner as in Example 1, except that a film that would become the sealant layer 24 was prepared by mixing COC and PE (LLDPE) together by further increasing the amount of PE than in Example 1.

The sealant layer 24 had a value of retardation of 500 nm and Tg of 40° C.

Comparative Example 3

A functional film was prepared in the same manner as in Example 1, except that the support 12 was changed to a polyethylene terephthalate film (Cosmoshine manufactured by TOYOBO CO., LTD.) having a thickness of 100 μm, a width of 1,000 mm, and a length of 50 m.

The support 12 had a value of retardation of 306 nm and Tg of 90° C.

Comparative Example 4

A functional film was prepared in the same manner as in Example 1, except that the support 12 was changed to a COC film (Apel manufactured by Mitsui Chemicals, Inc.) having a thickness of 100 μm, a width of 1,000 mm, and a length of 50 m, and the sealant layer 24 was changed to a COC film (Opcon manufactured by KEIWA Inc.) having a thickness of 50 μm.

The support 12 had a value of retardation of 5 nm and Tg of 125° C., and the sealant layer 24 had a value of retardation of 5 nm and Tg of 130° C.

<Preparation of Organic EL Device>

A 20 mm×20 mm glass plate having a thickness of 500 μm was prepared as the element substrate 30.

The periphery (2 mm) of the element substrate 30 was masked with ceramic, and the element substrate 30 having undergone masking was loaded in a general vacuum vapor deposition apparatus. By vacuum vapor deposition, an electrode composed of metal aluminum having a thickness of 100 nm was formed, and then a lithium fluoride layer having a thickness of 1 nm was formed.

Thereafter, on the element substrate 30 on which the electrode and the lithium fluoride layer were formed, the following organic compound layers were sequentially formed by vacuum vapor deposition.

(Light Emitting Layer-Cum-Electron Transport Layer)
Tris(8-hydroxyquinolinato)aluminum: film thickness of 60 nm
(Second Hole Transport Layer)
N,N'-diphenyl-N,N'-dinaphthylbenzidine: film thickness of 40 nm
(First Hole Transport Layer)
Copper phthalocyanine: film thickness of 10 nm The element substrate 30 on which the above organic compound layers were formed was loaded in a general sputtering apparatus. By using indium tin oxide (ITO) as a target, a transparent electrode composed of a thin ITO film having a thickness of 0.2 μm was formed by means of DC magnetron sputtering, thereby forming the light emitting element 32 using an organic EL material.

Subsequently, from the element substrate 30 on which the light emitting element 32 was formed, the mask was removed.

The element substrate 30 from which the mask was removed was loaded in a general plasma CVD apparatus, and by means of plasma CVD (CCP-CVD), the passivation film 34 with a thickness of 1,500 nm composed of silicon nitride was formed, thereby preparing the organic EL device 36.

That is, the organic EL device 36 has a constitution in which a single light emitting element 32 was formed at the center thereof, and the passivation film 34 covering the entire surface of the light emitting element 32 and the element substrate 30 was formed.

As raw material gases for forming the passivation film 34, silane gas ($SiH_4$), ammonia gas ($NH_3$), nitrogen gas ($N_2$), and hydrogen gas ($H_2$) were used. The silane gas was supplied in an amount of 100 sccm, the ammonia gas was supplied in an amount of 200 sccm, the nitrogen gas was supplied in an amount of 500 sccm, and the hydrogen gas was supplied in an amount of 500 sccm. The formation pressure (pressure for forming a film) was 50 Pa.

For plasma excitation, a power of 3,000 W was supplied at a frequency of 13.56 MHz.

<Evaluation of Gas Barrier Properties>

By using each of the functional films of Examples 1 to 5 and Comparative examples 1 to 4, an organic EL laminate in which the organic EL device 36 was sealed was prepared.

Specifically, the functional films of Examples 1 to 5 and Comparative examples 1 to 4 were cut in 20 mm×20 mm. Each of the cut functional films was laminated on the prepared organic EL device 36, in a state in which the sealant layer 24 and the passivation film 34 faced each other.

The laminate was heated on a hot plate from the side of the support 12, such that the temperature of the sealant layer 24 became 30° C. higher than Tg of the sealant layer 24. At a point in time when the temperature of the sealant layer 24 reached an intended temperature, the functional film was pressed against the organic EL device 36, and heat sealing of the functional film and the organic EL device 36 was performed. In this way, an organic EL laminate was prepared in which the organic EL device 36 was sealed with the functional film as shown in FIG. 2.

The prepared organic EL laminate was left in an environment with a temperature of 60° C. and a humidity of 90% RH for 200 hours.

After being left in the aforementioned environment, each of the organic EL laminates was caused to emit light by applying a voltage of 7 V thereto by using a source measure unit of a type of SMU 2400 manufactured by Keithley Instruments Inc.

The organic EL laminate was observed with a microscope from the side of the support 12 of the functional film, so as to determine whether or not a dark spot occurred. The gas barrier properties of each of the organic EL laminates were evaluated based on the following criteria.

AA: The area of the portion of dark spot is equal to or less than 0.1% of the area of the light emitting element 32.
A: The area of the portion of dark spot is greater than 0.1% and equal to or less than 1% of the area of the light emitting element 32.
B: The area of the portion of dark spot is greater than 1% and equal to or less than 3% of the area of the light emitting element 32.
C: The area of the portion of dark spot is greater than 3% of the area of the light emitting element 32.

<Total Light Transmittance>

The total light transmittance of the prepared functional films was measured based on JIS K 7361 by using NDH 5000 manufactured by NIPPON DENSHOKU INDUSTRIES Co., LTD.

<Haze>

The haze of the prepared functional films was measured based on JIS K 7136 by using NDH 5000 manufactured by NIPPON DENSHOKU INDUSTRIES Co., LTD.

<Retardation>

The value of retardation of the prepared functional films was measured by using KOBRA manufactured by Oji Scientific Instruments, under conditions of an incidence angle of 0° and a measurement wavelength of 500 nm.

The results thereof are shown in the following table.

acteristics such as the total light transmittance, haze, and value of retardation (Re), compared to Comparative examples 1 to 4. The functional films 10 of Examples 1 to 5 exhibited excellent gas barrier properties while inhibiting the deterioration of the optical characteristics.

In Example 2, the mixed layer 28 was not formed between the support 12 and the protective inorganic film 14. The mixed layer 28 in Example 3 was thin (10 nm). It is considered, thus, that the gas barrier properties and optical characteristics of Examples 2 and 3 were poorer than in Example 1. In Example 4, the mixed layer 26 was not formed between the adhesive layer 20 and the sealant layer 24. The mixed layer 26 in Example 5 was thin (20 nm). It is considered, thus, that the adhesiveness between the adhesive layer 20 and the sealant layer 24 was slightly weak, and thus a little moisture permeated the organic EL laminate from the space between the adhesive layer 20 and the sealant layer 24. It is considered that, consequently, in Examples 4 and 5, the gas barrier properties were poorer than in Example 1, and optical characteristics also deteriorated.

In Comparative example 1, Tg of the sealant layer 24 was higher than Tg of the support 12. It is considered that, consequently, at the time of sealing the organic EL device 36, the inorganic film 18 or the like was broken due to the deformation or the like of the support 12, and the gas barrier properties deteriorated.

In Comparative example 2, the value of retardation of the sealant layer 24 was high, and in Comparative example 3, the value of retardation of the support 12 was high. It is considered that, consequently, the optical characteristics of the functional film deteriorated.

In Comparative example 4, Tg of the sealant layer 24 was higher than Tg of the support 12. It is considered that, consequently, at the time of sealing the organic EL device 36, the inorganic film 18 or the like was broken due to the deformation or the like of the support 12, and the gas barrier properties deteriorated.

The above results clearly show the effects of the present invention.

TABLE 1

| | Support | | Sealant layer | | Thickness of mixed layer | | Gas barrier properties | Total light transmittance | Haze | Re |
|---|---|---|---|---|---|---|---|---|---|---|
| | Re | Tg | Re | Tg | Support/ inorganic film | Adhesive/ sealant | | | | |
| Example 1 | 3 nm | 135° C. | 100 nm | 50° C. | 25 nm | 30 nm | AA | 90% | 0.5% | 80 nm |
| Example 2 | 3 nm | 135° C. | 100 nm | 50° C. | N/A | 30 nm | B | 86% | 0.9% | 105 nm |
| Example 3 | 3 nm | 135° C. | 100 nm | 50° C. | 10 nm | 30 nm | A | 88% | 0.7% | 90 nm |
| Example 4 | 3 nm | 135° C. | 100 nm | 50° C. | 25 nm | N/A | B | 87% | 0.8% | 90 nm |
| Example 5 | 3 nm | 135° C. | 100 nm | 50° C. | 25 nm | 20 nm | A | 88% | 0.6% | 85 nm |
| Comparative example 1 | 3 nm | 135° C. | 5 nm | 142° C. | 25 nm | 5 nm | C | 87% | 0.7% | 5 nm |
| Comparative example 2 | 3 nm | 135° C. | 500 nm | 40° C. | 25 nm | 40 nm | AA | 78% | 1.5% | Equal to or greater than 500 nm |
| Comparative example 3 | 306 nm | 90° C. | 100 nm | 50° C. | 40 nm | 30 nm | AA | 75% | 1.9% | Equal to or greater than 1,000 nm |
| Comparative example 4 | 5 nm | 125° C. | 5 nm | 130° C. | 30 nm | 10 nm | C | 87% | 0.7% | 5 nm |

As shown in Table 1, at the time of sealing the organic EL element, the functional films 10 of Examples 1 to 5 exhibited the better gas barrier properties and the better optical char- The functional film of the present invention can be preferably used in organic EL displays, organic EL illumination devices, and the like.

EXPLANATION OF REFERENCES

10: functional film
12: support
14: protective inorganic film
16: organic film
18: inorganic film
20: adhesive layer
24: sealant layer
26, 28: mixed layer
30: element substrate
32: light emitting element
34: passivation film
36: organic EL device

What is claimed is:

1. A functional film comprising:
a support which has a value of retardation of equal to or less than 50 nm;
a protective inorganic film which is formed on the support;
one or more combinations, each of which is composed of an inorganic film and an organic film that is an underlayer of the inorganic film, formed on the protective inorganic film;
a sealant layer which adheres onto the uppermost inorganic film by an adhesive layer; and
a mixed layer, in which a component of the adhesive layer is mixed with a component of the sealant layer, between the adhesive layer and the sealant layer,
wherein the sealant layer has a value of retardation of equal to or less than 300 nm and has a glass transition temperature lower than that of the support, and
wherein the thickness of the mixed layer, in which a component of the adhesive layer is mixed with a component of the sealant layer, is 5 nm to 100 nm.

2. The functional film according to claim 1, further comprising a mixed layer, in which a component of the support is mixed with a component of the protective inorganic film, between the support and the protective inorganic film.

3. The functional film according to claim 1,
wherein a glass transition temperature of the sealant layer is lower than that of the adhesive layer, and
the glass transition temperature of the adhesive layer is lower than that of the support and the organic film.

4. The functional film according to claim 1,
wherein a thickness of the sealant layer is 10 μm to 100 μm, and
the adhesive layer is thinner than the sealant layer.

5. The functional film according to claim 1,
wherein the support and the sealant layer are formed of a same material.

6. The functional film according to claim 1,
wherein at least either the support or the sealant layer is formed of a cycloolefin copolymer.

7. The functional film according to claim 1,
wherein the adhesive layer contains a silane coupling agent,
the uppermost inorganic film is a film of a silicon compound, and
at least either an —O group or a —OH group is introduced into the surface of the film.

8. The functional film according to claim 1,
wherein each of the protective inorganic film and the inorganic film is a film of silicon nitride.

9. The functional film according to claim 1,
wherein the thickness of the protective inorganic film is 5 nm to 200 nm.

* * * * *